US012763546B2

(12) United States Patent
Sorg

(10) Patent No.: US 12,763,546 B2
(45) Date of Patent: Oct. 13, 2026

(54) RADIATION-EMITTING LASER COMPONENT AND METHOD FOR PRODUCING A RADIATION-EMITTING LASER COMPONENT

(71) Applicant: ams-OSRAM International GmbH, Regensburg (DE)

(72) Inventor: Jörg Erich Sorg, Regensburg (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 649 days.

(21) Appl. No.: 18/255,124

(22) PCT Filed: Nov. 29, 2021

(86) PCT No.: PCT/EP2021/083351
§ 371 (c)(1),
(2) Date: May 31, 2023

(87) PCT Pub. No.: WO2022/117501
PCT Pub. Date: Jun. 9, 2022

(65) Prior Publication Data
US 2024/0006841 A1 Jan. 4, 2024

(30) Foreign Application Priority Data
Dec. 3, 2020 (DE) ......................... 102020132133.3

(51) Int. Cl.
*H01S 5/02* (2006.01)
*H01S 5/02315* (2021.01)
(Continued)

(52) U.S. Cl.
CPC ........ *H01S 5/0216* (2013.01); *H01S 5/02315* (2021.01); *H01S 5/0234* (2021.01);
(Continued)

(58) Field of Classification Search
CPC .. H01S 5/0216; H01S 5/02315; H01S 5/0234; H01S 5/0237; H01S 5/04256; H01S 5/22
See application file for complete search history.

(56) References Cited

U.S. PATENT DOCUMENTS

| | | | |
|---|---|---|---|
| 5,943,553 | A | 8/1999 | Spaeth |
| 2002/0146855 | A1 | 10/2002 | Goto et al. |

(Continued)

FOREIGN PATENT DOCUMENTS

| | | | |
|---|---|---|---|
| CN | 105830291 | A | 8/2016 |
| JP | 2010199274 | A | 9/2010 |
| WO | 2020174949 | A1 | 9/2020 |

OTHER PUBLICATIONS

Herve, D. (Authorized officer), International Search Report and Written opinion dated Mar. 2, 2022, PCT Application No. PCT/EP2021/083351, 12 pages (including English translation).

(Continued)

*Primary Examiner* — Yuanda Zhang
(74) *Attorney, Agent, or Firm* — MH2 Technology Law Group LLP

(57) ABSTRACT

The invention relates to a radiation-emitting laser component including: —an edge-emitting laser diode which is designed to generate electromagnetic laser radiation, and —a substrate, on which the edge-emitting laser diode is arranged, wherein —the edge-emitting laser diode has a contact layer, —the substrate has a substrate web, and —the contact layer is connected to the substrate web by means of a solder layer in a mechanically stable manner. The invention also relates to a method for producing a radiation-emitting laser component.

15 Claims, 2 Drawing Sheets

(51) Int. Cl.

| | |
|---|---|
| ***H01S 5/0234*** | (2021.01) |
| ***H01S 5/0237*** | (2021.01) |
| ***H01S 5/042*** | (2006.01) |
| ***H01S 5/22*** | (2006.01) |

(52) U.S. Cl.

CPC ........ *H01S 5/0237* (2021.01); *H01S 5/04256* (2019.08); *H01S 5/22* (2013.01)

(56) References Cited

U.S. PATENT DOCUMENTS

| | | | | |
|---|---|---|---|---|
| 2005/0002428 | A1 | 1/2005 | Kwak et al. | |
| 2005/0041700 | A1 | 2/2005 | Tsunoda | |
| 2010/0296537 | A1 | 11/2010 | Kotani | |
| 2011/0249694 | A1 | 10/2011 | Nishiguchi et al. | |
| 2012/0051381 | A1 | 3/2012 | Shimizu et al. | |
| 2016/0315446 | A1 | 10/2016 | Taeger et al. | |
| 2020/0232618 | A1 * | 7/2020 | Rudy ....................... | B60Q 1/04 |
| 2020/0287355 | A1 | 9/2020 | Vierheilig et al. | |
| 2021/0384701 | A1 | 12/2021 | Ono et al. | |
| 2023/0104829 | A1 * | 4/2023 | Nishikawa .......... | H01S 5/02315 372/43.01 |

OTHER PUBLICATIONS

Karszewski, German Search Report issued in German Patent Application No. 102020132133.3 dated Jul. 13, 2021, 5 pages.

Chinese Office Action issued in corresponding Chinese Patent Application No. 2021800816183 dated Jul. 31, 2025, with English language translation, 15 pages.

German Office Action issued in German Patent Application No. 11 2021 004 885.6 dated Feb. 17, 2025, with English language translation, 10 pages.

German Office Action issued in German Patent Application No. 11 2021 004 885.6 dated Jun. 26, 2025, with English language translation, 8 pages.

Chinese Office Action Issued in corresponding Chinese Patent Application No. 2021800816183 dated Mar. 3, 2026, with English Language Translation, 10 pages.

* cited by examiner

RADIATION-EMITTING LASER COMPONENT AND METHOD FOR PRODUCING A RADIATION-EMITTING LASER COMPONENT

CROSS-REFERENCE TO RELATED APPLICATIONS

The present application is a national stage entry from International Application No. PCT/EP2021/083351, filed on Nov. 29, 2021, published as International Publication No. WO 2022/117501 A1 on Jun. 9, 2022, and claims priority to German Patent Application No. 10 2020 132 133.3, filed Dec. 3, 2020, the disclosures of all of which are hereby incorporated by reference in their entireties.

FIELD OF THE INVENTION

A radiation emitting laser component is disclosed. A method for producing a radiation emitting laser component is also disclosed.

BACKGROUND OF THE INVENTION

An object to be solved is to provide a radiation emitting laser component that is particularly reliable. A further object to be solved is to provide a method for producing such a radiation emitting laser component.

SUMMARY OF THE INVENTION

According to at least one embodiment, the radiation emitting laser component comprises an edge-emitting laser diode configured to generate electromagnetic laser radiation. For example, the edge-emitting laser diode is configured to emit electromagnetic laser radiation from a facet.

For example, the edge-emitting laser diode has a main extension plane. A vertical direction is perpendicular to the main extension plane and lateral directions are parallel to the main extension plane. Further, the edge-emitting laser diode extends along, for example, a main extension direction oriented parallel to one of the lateral directions.

For example, the facet is arranged in a plane which extends substantially perpendicular to the main extension direction. Substantially perpendicular means that the side surface is inclined by at most 5°, in particular by at most 1°, to a normal of the main extension direction. The electromagnetic laser radiation is in particular monochromatic and coherent laser light. The electromagnetic laser radiation is, for example, infrared, IR, radiation, visible radiation or ultraviolet, UV, radiation.

According to at least one embodiment, the radiation emitting laser component comprises a substrate on which the edge-emitting laser diode is arranged. For example, the substrate comprises, among other things, a base plate. The base plate has a main extension plane extending in lateral directions. Further, the substrate has, for example, a main extension direction that is parallel to the main extension direction of the edge-emitting laser diode.

The substrate is, for example, a connection carrier of the edge-emitting laser diode. Through the substrate, the edge-emitting laser diode can be supplied with current, for example. Furthermore, the edge-emitting laser diode can be cooled by the substrate, for example.

For example, the substrate is formed with or consists of a metallic and/or ceramic material. In particular, the base plate is formed with or consists of a ceramic material.

According to at least one embodiment of the radiation emitting laser component, the edge-emitting laser diode comprises a contact layer. Through the contact layer, a semiconductor body of the edge-emitting laser diode can be supplied with current, for example. Furthermore, the semiconductor body of the edge-emitting laser diode can be cooled by the substrate, for example.

The contact layer has, for example, a height in vertical direction of at least 0.05 micrometers and at most 5 micrometers, for example in about 1 micrometer. The contact layer comprises or consists of, for example, one or more of the following metals: Cu, Ti, Pt, Au, Ni, Rh, Pd, Cr.

According to at least one embodiment of the radiation emitting laser component, the substrate comprises a substrate bar. In particular, the substrate comprises the base plate and the substrate bar. For example, the substrate bar is arranged on the base plate. For example, the substrate bar is in direct contact with the base plate.

For example, the substrate bar comprises a top surface and side surfaces adjacent thereto. In particular, the top surface faces the edge-emitting laser diode. The substrate bar extends in lateral directions, for example, along the main extension direction of the edge-emitting laser diode.

The top surface of the substrate bar is connected to recessed outer surfaces of the substrate bar via the side surfaces, for example. The recessed outer surfaces of the substrate bar cover the base plate only in places, for example. Edge areas of the base plate are, for example, free of the recessed outer surfaces of the substrate bar.

For example, the substrate bar comprises or consists of a metal. For example, the substrate bar is formed from a different material than the base plate.

According to at least one embodiment of the radiation emitting laser component, the contact layer is mechanically stably connected to the substrate bar by means of a solder layer. In particular, the edge-emitting laser diode and the substrate are mechanically stably connected by means of the solder layer.

The solder layer has, for example, a height in vertical direction of at least 0.5 micrometers and at most 5 micrometers, for example approximately 2 micrometers. The solder layer comprises or consists of a metal, for example. The solder layer is formed with AuSn, for example, wherein a mass fraction of Au is 70%±5% in particular.

In at least one embodiment, the radiation emitting laser component comprises an edge-emitting laser diode configured to generate electromagnetic laser radiation and a substrate on which the edge-emitting laser diode is arranged. The edge-emitting laser diode comprises a contact layer and the substrate has a substrate bar, wherein the contact layer is mechanically stably connected to the substrate bar by means of a solder layer.

For example, it is possible that the edge-emitting laser diode is singulated from a wafer composite by laser scribing. In particular, the semiconductor body of the laser diode is based on GaN. During laser scribing, for example, the GaN material of the semiconductor body of the laser diode is decomposed into metallic Ga and $N_2$. The resulting nitrogen is particularly volatile, so that the resulting gallium remains as slag on a side surface of the semiconductor body.

For example, the edge-emitting laser diode is heated to about 300° C. when applied to a substrate. Since pure gallium, for example, has a liquidus temperature of 29.76° C., the gallium residues remaining during singulation, which are very mobile in particular, can lead to a direct contact between the laser diode and a substrate without a substrate bar. This results in short circuits and shunts, for example.

An idea of the radiation emitting laser component described here is, inter alia, that a distance between the edge-emitting laser diode and the base plate is increased with advantage compared to a substrate without a substrate bar. Such a spatial separation of the edge-emitting laser diode and the substrate, in particular the base plate, prevents the gallium residues from making a direct electrically conductive contact between the laser diode and the substrate, in particular the base plate. Such a radiation emitting laser component is advantageously particularly reliable.

According to at least one embodiment of the radiation emitting laser component, the edge-emitting laser diode comprises a semiconductor body having a ridge.

For example, the semiconductor body comprises a first semiconductor layer sequence of a first conductivity type and a second semiconductor layer sequence of a second conductivity type different from the first conductivity type. For example, the semiconductor body comprises a semiconductor substrate on which the first semiconductor layer sequence and the second semiconductor layer sequence are arranged.

For example, the first semiconductor layer sequence is p-doped and thus formed p-conductive. Furthermore, the second semiconductor layer sequence is, for example, n-doped and thus formed n-conductive. Thus, the first conductivity type is for example a p-conductivity type and the second conductivity type is for example an n-conductivity type. Alternatively, the first conductivity type is, for example, an n-conductivity type and the second conductivity type is, for example, a p-conductivity type.

For example, the semiconductor body is epitaxially grown. That is, for example, the first semiconductor layer sequence and the second semiconductor layer sequence are epitaxially grown in vertical direction on top of each other and on the semiconductor substrate.

Between the first semiconductor layer sequence and the second semiconductor layer sequence, for example, an active region is arranged which is configured to generate electromagnetic radiation. For example, the electromagnetic radiation generated in the active region is converted into electromagnetic laser radiation in the semiconductor body. In contrast to electromagnetic radiation, which is generated solely by spontaneous emission, electromagnetic laser radiation typically has a very high coherence length, a very narrow emission spectrum and/or a high degree of polarization.

The semiconductor body is preferably formed of or has a III/V compound semiconductor. The III/V compound semiconductor can be an arsenide compound semiconductor, a nitride compound semiconductor or a phosphide compound semiconductor.

For example, the semiconductor substrate faces away from the substrate. That is, the first semiconductor layer sequence and the second semiconductor layer sequence face the substrate, for example.

According to at least one embodiment of the radiation emitting laser component, the ridge of the semiconductor body has a top surface and side surfaces adjacent thereto. For example, the ridge of the semiconductor body is formed by a ridge-shaped elevated region of the semiconductor body. For example, the ridge of the semiconductor body protrudes as a protrusion from a recessed outer surface of the semiconductor body. The ridge of the semiconductor body extends in lateral direction, for example, along the main extension direction of the edge-emitting laser diode.

For example, the recessed outer surface is located lateral to the ridge of the semiconductor body. For example, the top surface of the ridge of the semiconductor body is directly connected to the recessed outer surface via the side surfaces of the ridge of the semiconductor body adjacent thereto. In particular, the top surface and the side surfaces and the recessed outer surface form a step profile.

According to at least one embodiment of the radiation emitting laser component, the contact layer covers the top surface and the side surfaces of the ridge of the semiconductor body and the recessed outer surface of the semiconductor body. For example, the ridge of the semiconductor body is embedded in the contact layer. Embedded here means that the top surface and the side surfaces of the ridge of the semiconductor body are completely covered with the contact layer. For example, the top surface and the side surfaces of the ridge of the semiconductor body are in direct contact with the contact layer.

For example, the recessed outer surface of the semiconductor body is only partially covered with the contact layer. For example, at least one edge region of the recessed outer surface is free of the contact layer. In the edge region, the semiconductor body is freely accessible, for example.

According to at least one embodiment of the radiation emitting laser component, the ridge of the semiconductor body and the substrate bar face each other. In particular, the ridge of the semiconductor body and the substrate bar are positioned opposite each other.

According to at least one embodiment of the radiation emitting laser component, the width of the substrate bar is smaller than a width of the semiconductor body. For example, the width of the substrate bar is smaller than the width of the semiconductor body by at least 20%, in particular by at least 50%. The widths each extend perpendicular to the main extension direction of the edge-emitting laser diode and each extend along the main extension plane of the edge-emitting laser diode.

In particular, the substrate bar and the semiconductor body each extend along the main extension direction of the laser diode. For example, the substrate bar extends within the first side surface of the semiconductor body and the second side surface of the semiconductor body in plan view. In this case, the substrate bar and the semiconductor body completely overlap each other in lateral directions in plan view.

The side surfaces of the substrate bar have, for example, a distance to the first side surface of the semiconductor body and the second side surface of the semiconductor body in lateral directions, respectively. Such a distance advantageously prevents a short-circuit of the laser diode with the substrate due to the gallium residues.

According to at least one embodiment of the radiation emitting laser component, the ridge of the semiconductor body is arranged asymmetrically in lateral directions in the contact layer. For example, the contact layer and the ridge of the semiconductor body both extend in lateral directions along the main extension direction of the edge-emitting laser diode. For example, a cross-section perpendicular to the main extension direction through the contact layer and the ridge of the semiconductor body does not exhibit mirror symmetry along the main extension direction.

For example, the ridge of the semiconductor body is not centered in the contact layer in lateral directions. In particular, the ridge of the semiconductor body has a greater distance to a first side surface of the semiconductor body than to a second side surface of the semiconductor body opposite the first side surface, or vice versa.

According to at least one embodiment of the radiation emitting laser component, the semiconductor body comprises a first semiconductor layer of a first conductivity type and a second semiconductor layer of a second conductivity type different from the first conductivity type, and the first semiconductor layer faces the substrate.

For example, the contact layer is arranged on the first semiconductor layer. For example, the first semiconductor layer is only partially covered with the contact layer. For example, at least one edge region of the first semiconductor layer is free of the contact layer. In the edge region, the first semiconductor layer is freely accessible, for example.

According to at least one embodiment of the radiation emitting laser component, the first conductivity type is a p-type conductivity type.

According to at least one embodiment of the radiation emitting laser component, the substrate bar and the contact layer overlap with each other in lateral directions in plan view. For example, the substrate bar and the contact layer have largely equal dimensions in lateral directions. Here, largely equal dimensions means that a width of the substrate bar and a width of the contact layer differ from each other by at most +/−10%, in particular by at most +/−5%. The widths extend perpendicular to the main extension direction of the edge-emitting laser diode.

For example, a length of the substrate bar is greater than a length of the contact layer. The lengths extend along the edge-emitting laser diode.

For example, it is possible that the substrate bar and the contact layer have the same width. For example, at least one side surface of the substrate bar and at least one side surface of the contact layer are arranged in a common plane extending in the vertical direction.

According to at least one embodiment of the radiation emitting laser component, the solder layer does not protrude beyond at least one side surface of the substrate bar in lateral directions. For example, the side surface of the substrate bar is substantially free of the solder layer. Substantially free means that small particles of a solder material of the solder layer can be arranged on the side surface due to the manufacturing process.

Advantageously, this can further increase a reliability of the radiation emitting laser component.

According to at least one embodiment of the radiation emitting laser component, a metallic layer is arranged on the substrate with the substrate bar. For example, the metallic layer completely covers the substrate bar. In particular, the metallic layer completely covers a top surface and side surfaces adjacent thereto of the substrate bar. For example, the metallic layer is in direct contact with the substrate bar, particularly with the top surface the side surfaces. Further, the base plate is at least partially covered with the contact layer.

The metallic layer has, for example, a height in the vertical direction of at least 0.1 micrometer and at most 0.5 micrometer. For example, the metallic layer comprises or consists of one or more of the following metals: Au, Pt, Ti.

For example, the metallic layer comprises a plurality of layers, each layer being formed with one of the metals.

Due to the metallic layer, the substrate is particularly reliably connected to the edge-emitting laser diode.

According to at least one embodiment of the radiation emitting laser component, the substrate bar has a height of at least 5 micrometers and at most 15 micrometers. For example, the height of the substrate bar in the vertical direction is approximately 10 micrometers.

A method for producing a radiation emitting laser component is further specified. In particular, the method can be used to produce a radiation emitting laser component described herein. That is, the radiation emitting laser component described herein is producible by the described method or is produced by the described method. All features disclosed in connection with the radiation emitting laser component are therefore also disclosed in connection with the method, and vice versa.

According to at least one embodiment of the method, an edge-emitting laser diode comprising a contact layer is provided.

According to at least one embodiment of the method, a substrate comprising a substrate bar is provided. For example, the substrate bar is applied to a base plate.

According to at least one embodiment of the method, a solder material is applied to the substrate bar or the contact layer. In particular, the solder material comprises the same materials as the solder layer.

For example, the solder material has a height in the vertical direction of at least 1 micrometer and at most 5 micrometers, for example 3 micrometers. For example, the height of the solder material is greater than a height of the solder layer. According to at least one embodiment of the method, the edge-emitting laser diode is applied to the substrate. The edge-emitting laser diode, in particular the contact layer, and the substrate, in particular the substrate bar, are directly connected to each other via the solder material.

According to at least one embodiment of the method, the solder material is heated to a first temperature. For example, the solder material is heated such that the solder material bonds to the edge-emitting laser diode, in particular the contact layer. Further, the solder material is heated, for example, such that the solder material bonds to the substrate, in particular the substrate bar. The bonding is, for example, a soldering process.

For example, the first temperature has a temperature of at least 200° C. and at most 400° C. For example, the first temperature is approximately 300° C. In particular, the solder material exhibits a liquid aggregate state at the first temperature.

According to at least one embodiment of the method, a solder layer is generated by cooling the solder material. For example, the solder layer is cooled to a second temperature. The second temperature is, for example, 30° C. The cooling causes the solder material to solidify. After cooling, the solder material exhibits a solid aggregate state.

According to at least one embodiment of the process, the contact layer is mechanically stably connected to the substrate bar by means of the solder layer.

According to at least one embodiment of the process, the solder material is deposited asymmetrically in lateral directions on the substrate bar or the contact layer.

For example, a cross-section perpendicular to the main extension direction through the substrate bar and/or contact layer and through the solder material does not exhibit mirror symmetry along the main extension direction.

For example, the solder material is not centered in lateral directions on the substrate bar or on the contact layer. In particular, the solder material of the first side surface of the semiconductor body has a greater distance than to the second side surface of the semiconductor body or vice versa.

For example, the substrate and the contact layer can be divided along the main extension direction by a virtual line into two equal parts, a first part and a second part. If the ridge of the semiconductor body is located inside the first part, the second part has a larger amount of the solder material than the first part or vice versa. In particular, when the ridge of the semiconductor body is arranged within the first part, the second part has a larger coverage area with the solder material than the first part or vice versa.

According to at least one embodiment of the method, the solder layer does not protrude beyond at least one side surface of the substrate bar dependent on a quantity of the solder material. In particular, the solder layer does not protrude beyond the side surface of the substrate bar dependent on the coverage area of the solder material of the first part and the second part.

For example, the side surface of the substrate bar is substantially free of the solder material. Substantially free means that small particles of the solder material of the solder layer can be arranged on the side surface due to the manufacturing process.

According to at least one embodiment of the method, during heating, the substrate is heated at least in places by a laser process. The laser process can heat the substrate only locally in a region where the substrate bar is positioned. For example, the region is irradiated with an infrared laser.

According to at least one embodiment of the method, during heating, the edge-emitting laser diode is heated at least in places by a laser process. The laser process can heat the edge-emitting laser diode only in a region where the contact layer is positioned.

Alternatively, the edge-emitting laser diode and the substrate can be heated from both sides using a heating stamp.

BRIEF DESCRIPTION OF THE DRAWINGS

In the following, the radiation emitting laser component and the method for producing the radiation emitting laser component are explained in more detail with reference to the Figures by means of exemplary embodiments.

They show.

DETAILED DESCRIPTION

Elements that are identical, similar or have the same effect are given the same reference signs in the Figures. The Figures and the proportions of the elements shown in the Figures are not to be regarded as to scale. Rather, individual elements may be shown exaggeratedly large for better representability and/or for better comprehensibility.

Figure 1:
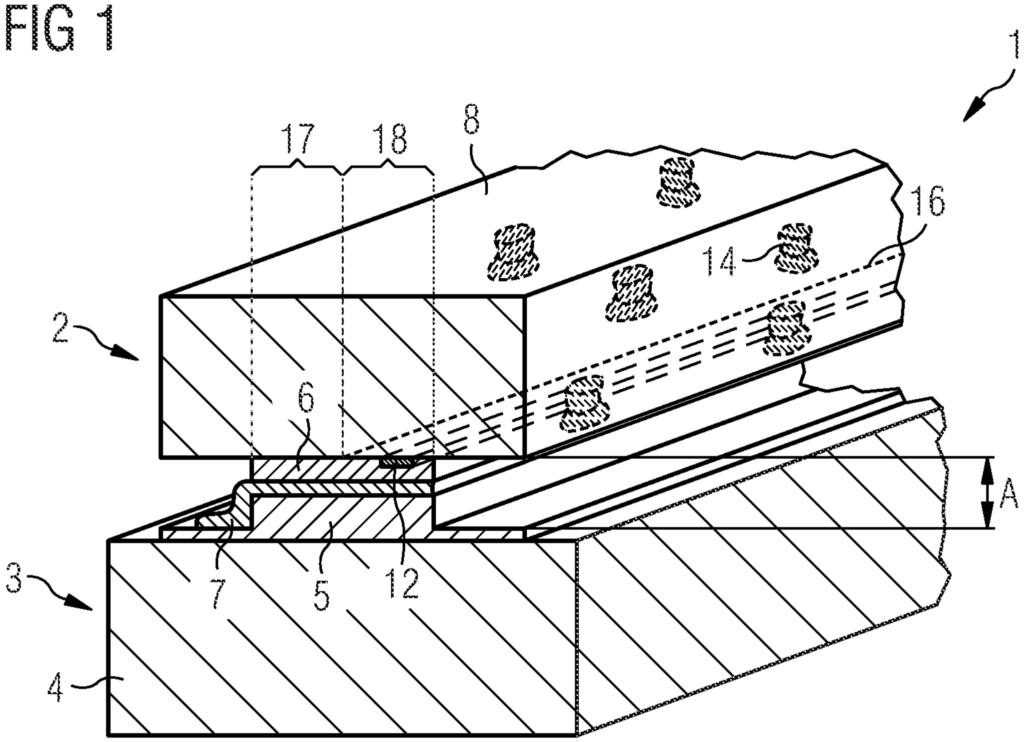
FIGS. 1 and 2 schematic sectional views of a radiation emitting laser component each according to an exemplary embodiment, and FIG. 3 a schematic sectional view of a method stage in the production of a radiation emitting laser component according to an embodiment.

The radiation emitting laser component according to the exemplary embodiment of FIG. 1 comprises an edge-emitting laser diode 2 and a substrate 3 on which the edge-emitting laser diode 2 is arranged.

The edge-emitting laser diode 2 has a semiconductor body 8 with a ridge 12. The ridge of the semiconductor body 12 protrudes as a protrusion from a recessed outer surface of the semiconductor body 8. The ridge of the semiconductor body 12 extends in lateral direction, for example, along the main extension direction of the edge-emitting laser diode 2.

The ridge of the semiconductor body 12 comprises a top surface and side surfaces adjacent thereto, the top surface and side surfaces and the recessed outer surface of the semiconductor body 8 forming a stepped profile.

A contact layer 6 is arranged on the semiconductor body 8 and the ridge of the semiconductor body 12. In this exemplary embodiment, the contact layer 6 covers the top surface and the side surfaces of the ridge of the semiconductor body 12 as well as the recessed outer surface of the semiconductor body 8. For example, the recessed outer surface of the semiconductor body 8 is covered with the contact layer 6 only laterally to the ridge of the semiconductor body 12. An edge region of the recessed outer surface of the semiconductor body 8, which is located in the region of side surfaces of the semiconductor body 8, is free of the contact layer 6.

The ridge of the semiconductor body 12 is arranged asymmetrically in lateral directions in the contact layer 6. The ridge of the semiconductor body 12 has a greater distance to a first side surface of the semiconductor body 8 than to a second side surface of the semiconductor body 8 opposite the first side surface.

The contact layer 6 can be divided along the main extension direction by a virtual line 16 into two equal parts, namely a first part 17 adjacent to the first side surface of the semiconductor body 8 and a second part 18 adjacent to the second side surface of the semiconductor body 8. The ridge of the semiconductor body 12 is arranged within the second part.

The substrate 3 comprises a base plate 4 and a substrate bar 5. The substrate bar 5 is arranged on the base plate 4 and faces the ridge of the semiconductor body 12. Like the ridge of the semiconductor body 12, the substrate bar 5 extends along the main extension direction of the edge-emitting laser diode 2.

The substrate bar 5 comprises a top surface and side surfaces adjacent thereto. The top surface is connected to a recessed outer surface of the substrate bar 5 via the side surfaces. The recessed outer surface of the substrate bar 5 only partially covers the base plate 4. Edge regions of the base plate 4 are free of the recessed outer surface of the substrate bar 5.

The contact layer 6 and the substrate bar 5 have equal dimensions in lateral directions. That is, a width of the contact layer 6 is equal to a width of the substrate bar 5.

Furthermore, a solder layer 7 is arranged between the contact layer 6 and the substrate bar 5. By means of the solder layer 7, the contact layer 6 is connected to the substrate bar 5 in a mechanically stable manner. That is, the edge-emitting laser diode 2 and the substrate 3 are mechanically stably connected to each other by means of the solder layer 7. The edge-emitting laser diode 2 can be electrically supplied with current via this connection and generated heat can be transported away from the edge-emitting laser diode 2 through the connection.

The substrate bar 5 can be divided along the main extension direction, analogously to the contact layer 6, by a virtual line 16 into two equal parts, namely a first part 17 adjacent to a first side surface of the substrate bar 5 and a second part 18 adjacent to the second side surface of the substrate bar 5.

The solder layer 7 protrudes beyond the side surface of the substrate bar 5 in lateral directions in the first part 17.

In the first part 17, the solder layer 7 covers the side surface and the outer surface of the substrate bar 5 adjacent thereto. In contrast, the solder layer 7 does not protrude beyond the side surface of the substrate bar 5 in lateral directions in the second part 18. In the second part 18, the side surface and the outer surface of the substrate bar 5 adjacent thereto are free of the solder layer 7.

For example, the substrate bar 5 has a height in vertical direction of, for example, approximately 10 micrometers. Thus, the substrate bar 5 provides a distance A between the recessed side surface of the substrate bar 5 and the recessed outer surface of the semiconductor body 8. The distance A is, for example, approximately 13 micrometers.

For example, gallium residues 14 are located on the side surfaces of the semiconductor body 8, which originate from a singulation process of the edge-emitting laser diode 2. Due to the distance A imparted by the substrate bar 5, these residues 14 cannot lead to short circuits and shunts. In particular, the residues 14 cannot produce a direct contact between the substrate 3 and the semiconductor body 8. Furthermore, direct contact of the residues 14 and the solder layer 7 can be prevented if the solder layer 7 does not protrude beyond the side surface of the substrate bar 5.

Figure 2:
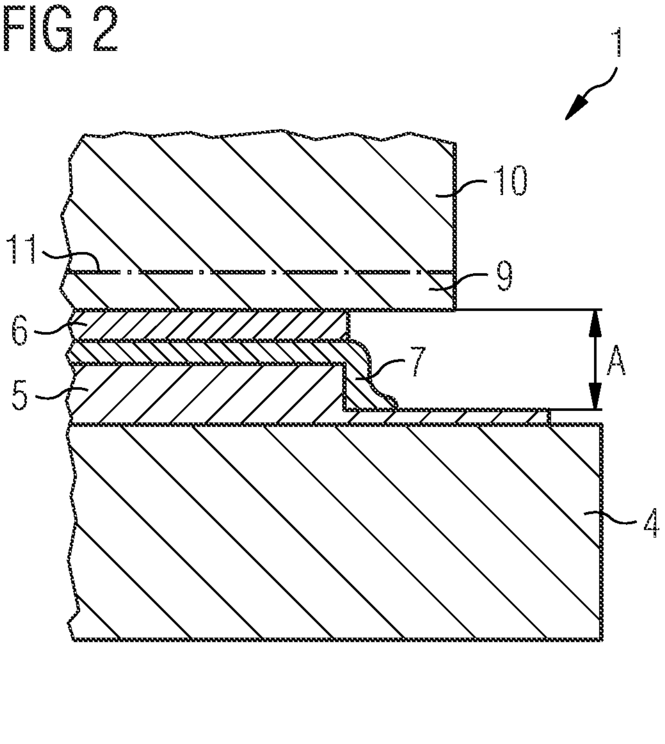

The edge-emitting laser diode 2 of the radiation emitting laser component 1 according to the exemplary embodiment of FIG. 2 does not comprise a ridge of the semiconductor body 12. The semiconductor body 8 comprises a first semiconductor layer sequence 9 of a first conductivity type and a second semiconductor layer sequence 10 of a second conductivity type different from the first conductivity type. The first conductivity type is a p-conductivity type and the second conductivity type is an n-conductivity type.

An active region 11 is arranged between the first semiconductor layer sequence 9 and the second semiconductor layer sequence 10, which is configured to generate electromagnetic radiation.

The first semiconductor layer sequence 9 of the p-conductivity type is facing the substrate bar 5.

Figure 3:
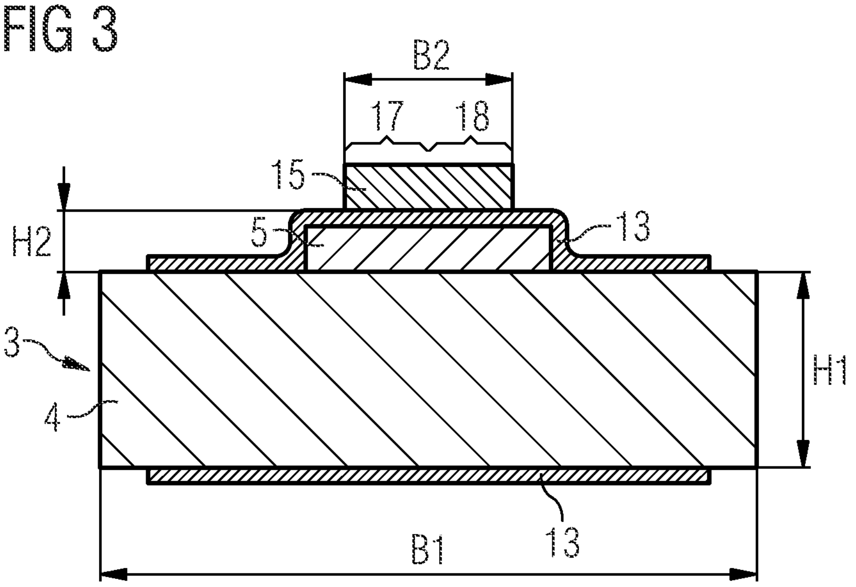

In the method stage according to the exemplary embodiment of FIG. 3, after providing a substrate 3 having a substrate bar 5, a solder material 15 is applied to the substrate bar 5.

In this exemplary embodiment, the substrate bar 5 and an outer surface laterally adjacent thereto are covered by a metallic layer 13. The metallic layer 13 comprises, for example, three layers. The first layer comprises, for example, Ti having a height of at most 100 nanometers, the second layer comprises, for example, Pt having a height of at least 50 nanometers and at most 100 nanometers, and the third layer comprises, for example, Au having a height of at least 20 nanometers and at most 30 nanometers. The third layer faces away from the substrate bar 5.

The third layer, for example comprising Au, is advantageously particularly well wettable. The first layer and the second layer form, for example, a barrier layer to the substrate bar 5. In this exemplary embodiment, the solder material 15 is arranged on the metallic layer 13. That is, the solder material 15 is in direct contact with the metallic layer 13.

The substrate bar 5 can be divided along the main extension direction by a virtual line 16 into two equal parts, namely a first part 17 and a second part 18, analogously to the contact layer 6. In this exemplary embodiment, the first part has a larger amount of the solder material 15 than the second part. That is, the first part has a larger coverage area with the solder material 15 than the second part.

To apply an edge-emitting laser diode 2, the solder material 15 is heated so that the solder material 15 is in a flowable form. By applying the solder material 15 asymmetrically, it is possible that the solder material 15 is not pressed out in lateral directions over a side surface in the second part 18 when the edge-emitting laser diode 2 is applied to the solder material 15. In contrast, when the solder material 15 is applied in the first part 17, the solder material 15 is pressed out in lateral directions over the side surface of the substrate bar 5.

For example, a width of the base plate B1 is approximately 0.5 millimeters and a width of the solder material B2 is approximately 0.04 millimeters. A height of the base plate H1 is, for example, approximately 0.2 millimeters and a height of the substrate bar H2 is, for example, approximately 0.01 millimeters.

An edge-emitting laser diode 2 comprising a contact layer 6 is provided below. The edge-emitting laser diode 2 is applied on the substrate 3 with the solder material 15. The assembly is subsequently heated to a first temperature. After a cooling process of the solder material 15, the solder layer 7 is produced from the solder material 15, which mechanically stably connects the contact layer 6 to the substrate bar 5.

The features and exemplary embodiments described in connection with the Figures can be combined with each other according to further exemplary embodiments, even if not all combinations are explicitly described. Furthermore, the exemplary embodiments described in connection with the Figures can alternatively or additionally have further features according to the description in the general part.

The invention is not limited to these by the description based on the exemplary embodiments. Rather, the invention encompasses any new feature as well as any combination of features, which in particular includes any combination of features in the patent claims, even if this feature or combination itself is not explicitly stated in the patent claims or exemplary embodiments.

The invention claimed is:

1. A radiation emitting laser component comprising:
- an edge-emitting laser diode configured to generate electromagnetic laser radiation, and
- a substrate on which the edge-emitting laser diode is arranged, wherein
- the edge-emitting laser diode comprises a contact layer,
- the substrate has a substrate bar,
- the contact layer is mechanically stably connected to the substrate bar by means of a solder layer,
- the substrate bar and the contact layer have a same width,
- the edge-emitting laser diode has a semiconductor body with a ridge,
- the ridge of the semiconductor body and the substrate bar face each other, and
- a width of the substrate bar is smaller than a width of the semiconductor body.

2. The radiation emitting laser component according to claim 1, in which
- the ridge of the semiconductor body has a top surface and side surfaces adjacent thereto, and
- the contact layer covers the top surface and the side surfaces of the ridge of the semiconductor body and a recessed outer surface of the semiconductor body.

3. The radiation emitting laser component according to claim 1, in which the ridge of the semiconductor body is arranged asymmetrically in lateral directions in the contact layer.

4. The radiation emitting laser component according to claim 1, in which
- the semiconductor body comprises a first semiconductor layer of a first conductivity type and a second semiconductor layer of a second conductivity type different from the first conductivity type, and
- the first semiconductor layer faces the substrate.

5. The radiation emitting laser component according to claim 4, in which the first conductivity type is a p-type conductivity type.

6. The radiation emitting laser component according to claim 1, in which the substrate bar and the contact layer overlap with each other in lateral directions in plan view.

7. The radiation emitting laser component according to claim 1, in which the solder layer does not protrude beyond at least one side surface of the substrate bar in lateral directions.

8. The radiation emitting laser component according to claim 1, in which a metallic layer is arranged on the substrate with the substrate bar.

9. The radiation emitting laser component according to claim 1, in which the substrate bar has a height of at least 5 micrometers and at most 15 micrometers.

10. A method for producing a radiation emitting laser component, comprising:

providing an edge-emitting laser diode comprising a contact layer, providing a substrate having a substrate bar, applying a solder material to the substrate bar or the contact layer, and applying the edge-emitting laser diode to the substrate, heating the solder material to a first temperature, producing a solder layer by cooling the solder material, wherein the contact layer is mechanically stably connected to the substrate bar by means of the solder layer, the substrate bar and the contact layer have a same width, the edge-emitting laser diode has a semiconductor body with a ridge, the ridge of the semiconductor body and the substrate bar face each other, and a width of the substrate bar is smaller than a width of the semiconductor body.

11. The method according to claim 10, wherein the solder material is applied asymmetrically in lateral directions on the substrate bar or the contact layer.

12. The method according to claim 10, wherein the solder layer does not protrude beyond at least one side surface of the substrate bar depending on an amount of the solder material.

13. The method according to claim 10, wherein during heating, the substrate is heated at least in places with a laser process.

14. The method according to claim 10, wherein during heating, the edge-emitting laser diode is heated at least in places with a laser process.

15. A radiation emitting laser component comprising:

an edge-emitting laser diode configured to generate electromagnetic laser radiation; and a substrate on which the edge-emitting laser diode is arranged, wherein:

the edge-emitting laser diode comprises a contact layer, the edge-emitting laser diode comprises a semiconductor body with a ridge, the ridge of the semiconductor body is embedded in the contact layer, the substrate has a substrate bar, the contact layer is mechanically stably connected to the substrate bar by means of a solder layer, the ridge of the semiconductor body and the substrate bar face each other, and a width of the substrate bar is smaller than a width of the semiconductor body.

* * * * *